(12) United States Patent
Li et al.

(10) Patent No.: US 9,595,624 B2
(45) Date of Patent: Mar. 14, 2017

(54) STRAIN ENGINEERED BANDGAPS

(71) Applicant: Massachusetts Institute of Technology, Cambridge, MA (US)

(72) Inventors: Ju Li, Weston, MA (US); Xiaofeng Qian, Winchester, MA (US); Ji Feng, Beijing (CN)

(73) Assignees: Massachussets Institute of Technology, Cambridge, MA (US); Peking University, Beijing (CN)

( * ) Notice: Subject to any disclaimer, the term of this patent is extended or adjusted under 35 U.S.C. 154(b) by 445 days.

(21) Appl. No.: 13/941,215

(22) Filed: Jul. 12, 2013

(65) Prior Publication Data

US 2014/0017839 A1    Jan. 16, 2014

Related U.S. Application Data

(60) Provisional application No. 61/670,752, filed on Jul. 12, 2012.

(51) Int. Cl.

| | |
|---|---|
| *H01L 27/15* | (2006.01) |
| *H01L 31/0352* | (2006.01) |
| *H01L 33/24* | (2010.01) |
| *H01L 31/18* | (2006.01) |
| *H01L 33/00* | (2010.01) |
| *H05B 33/08* | (2006.01) |
| *H01L 31/101* | (2006.01) |
| *H01L 33/26* | (2010.01) |

(52) U.S. Cl.
CPC .. *H01L 31/0352* (2013.01); *H01L 31/035209* (2013.01); *H01L 31/1013* (2013.01); *H01L 31/18* (2013.01); *H01L 33/005* (2013.01); *H01L 33/24* (2013.01); *H05B 33/0803* (2013.01); *H01L 33/26* (2013.01)

(58) Field of Classification Search
USPC ............... 257/87; 250/200, 216; 438/36, 93
See application file for complete search history.

(56) References Cited

U.S. PATENT DOCUMENTS

| | | | |
|---|---|---|---|
| 6,037,603 | A | 3/2000 | Nelson et al. |
| 8,890,113 | B2 * | 11/2014 | Ledentsov et al. ............. 257/13 |
| 2004/0181141 | A1 | 9/2004 | Kislov et al. |
| 2006/0222758 | A1 | 10/2006 | Taka et al. |
| 2010/0002402 | A1 | 1/2010 | Rogers et al. |

(Continued)

OTHER PUBLICATIONS

Feng et al., "Strain-Engineered Artificial Atom As A Broad-Spectrum Solar Energy Funnel," Nature Photonics, Nov. 25, 2012.
(Continued)

*Primary Examiner* — Telly Green
(74) *Attorney, Agent, or Firm* — Wolf, Greenfield & Sacks, P.C.

(57) ABSTRACT

An optoelectronic device as well as its methods of use and manufacture are disclosed. In one embodiment, the optoelectronic device includes a first optoelectronic material that is inhomogeneously strained. A first charge carrier collector and a second charge carrier collector are each in electrical communication with the first optoelectronic material and are adapted to collect charge carriers from the first optoelectronic material. In another embodiment, a method of photocatalyzing a reaction includes using a strained optoelectronic material.

36 Claims, 8 Drawing Sheets

(56) References Cited

U.S. PATENT DOCUMENTS

| | | |
|---|---|---|
| 2010/0229929 A1 | 9/2010 | Clifton |
| 2013/0092896 A1* | 4/2013 | Ledentsov et al. ............ 257/13 |
| 2016/0043270 A1 | 2/2016 | Li et al. |

OTHER PUBLICATIONS

Bertolazzi et al., "Stretching and Breaking of Ultrathin $MoS_2$," ACS NANO, vol. 5, No. 12, pp. 9703-9709, Nov. 16, 2011.
Lee et al., "Measurement of the Elastic Properties and Intrinsic Strength of Monolayer Graphene," Science, vol. 321, pp. 385-388, Jul. 18, 2008.
Castellamos-Gomez et al., "Local Strain Engineering in Atomically Thin $MoS_2$," arXiv: 1306.3804, Jun. 17, 2013.
Liu et al., "*Ab Initio* Calculation of Ideal Strength and Phonon Instability of Graphene Under Tension," Physical Review B, vol. 76, pp. 064120-1 to 064120-7 (2007).
Nam et al., "Strain-Induced Pseudoheterostructure Nanowires Confining Carriers At Room Temperature With Nanoscale-Tunable Band Profiles," Nano Letter, pp. A-F, May 25, 2013.
International Search Report and Written Opinion for PCT/US2013/050325 mailed Feb. 20, 2014.
International Preliminary Report on Patentability for Application No. PCT/US2013/050325 mailed Jan. 13, 2015.
Invitation to Pay Additional Fees for Application No. PCT/US2015/043549 mailed Oct. 16, 2015.
International Search Report and Written Opinion for Application No. PCT/US2015/043549 mailed Jan. 7, 2016.
Berashevich et al., On the Nature of Interlayer Interactions in a System of Two Graphene Fragments. The Journal of Physical Chemistry C. 2011;115:24666-73.
Blöchl, Projector augmented-wave method. Physical Review B. 1994;50(24):17953-79.
Brihuega et al., Unraveling the intrinsic and robust nature of van Hove singularities in twisted bilayer graphene. Physical Review Letters. Nov. 9, 2012;109(19):26 pages.
Ci et al., Atomic layers of hybridized boron nitride and graphene domains. Nat Mater. 2010;9:430-5.
Dai et al., Bilayer Phosphorene: Effect of Stacking Order on Bandgap and Its Potential Applications in Thin-Film Solar Cells. The Journal of Physical Chemistry Letters. 2014;5:1289-93.
Dean et al. Hofstadter's butterfly and the fractal quantum Hall effect in moire superlattices. Nature. 2013;497:598-602.
Fu et al., Tailoring Exciton Dynamics by Elastic Strain-Gradient in Semiconductors. Advanced Materials. 2014;26:2572-9.
Grimme, Semiempirical GGA-type density functional constructed with a long-range dispersion correction. Journal of Computational Chemistry. 2006;27:1787-99.
Hedin, New Method for Calculating the One-Particle Green's Function with Application to the Electron-Gas Problem. Physical Review. 1965;139:A796-A823.
Heyd et al., Hybrid functionals based on a screened Coulomb potential. The Journal of Chemical Physics. 2003;118:8207-15.
Hirshfeld, Bonded-atom fragments for describing molecular charge densities. Theoret. Chim. Acta. 1977; 44:129-38.
Hunt et al. Massive Dirac Fermions and Hofstadter Butterfly in a van der Waals Heterostructure. Science. 2013;340:1427-30.
Hybertsen et al., First-Principles Theory of Quasiparticles: Calculation of Band Gaps in Semiconductors and Insulators. Physical Review Letters. Sep. 23, 1985;55:1418-21.

Kim et al. Raman Spectroscopy Study of Rotated Double-Layer Graphene: Misorientation-Angle Dependence of Electronic Structure. Physical Review Letters. Jun. 15, 2012;108:246103.
Kresse et al., Efficiency of ab-initio total energy calculations for metals and semiconductors using a plane-wave basis set. Computational Materials Science. 1996;6:15-50.
Kresse et al., Efficient iterative schemes for ab initio total-energy calculations using plane-wave basis set. Physical Review B. Oct. 15, 1996;54:11169-86.
Li et al., Black phosphorus field-effect transistors. Nature Nanotechnology. Mar. 2, 2014;9:372-7. DOI: 10.1038/NNANO.2014.35.
Li et al., Elastic strain engineering for unprecedented materials properties. MRS Bull. Feb. 2014;39:108-14. DOI: 10.1557/mrs.2014.3.
Liu et al., In-plane heterostructures of graphene and hexagonal boron nitride with controlled domain sizes. Nat Nanotechnol. Jan. 27, 2013;8:119-24. DOI: 10.1038/NNANO.2012.256.
Lopes Dos Santos et al., Graphene Bilayer with a Twist: Electronic Structure. Physical Review Letters. Dec. 21, 2007;99:256802.
Morell et al., Flat Bands in slightly twisted bilayer graphene.: Tight binding calculations. The American Physical Society. Physical Review B. 2010;82:121407(R). 4 pages.
Onida et al., Electronic excitations: density-functional versus many-body Green's-function approaches. Reviews of Modern Physics. Apr. 2002;74:601-59.
Ponomarenko et al. Cloning of Dirac fermions in graphene superlattices. Nature advance. May 30, 2013;497:594-597. doi:10.1038/nature12187.
Qi et al., Slip corona surrounding bilayer graphene nanopore. Nanoscale. 2012;4:5989-97.
Salpeter et al., A Relativistic Equation for Bound-State Problems. Physical Review. Dec. 15, 1951;84(6):1232-42.
Shevchenko et al., Structural diversity in binary nanoparticle superlattices. Nature. Jan. 5, 2006;439:55-9. doi:10.1038/nature04414.
Shockley et al., Detailed Balance Limit of Efficiency of p-n. Junction Solar Cells. J. Appl. Phys. Mar. 1961;32(3):510-19. doi: 10.1063/1.1736034.
Suess et al. Analysis of enhanced light emission from highly strained germanium microbridges. Nat Photon. Apr. 14, 2013;7:466-72. DOI: 10.1038/NPHOTON.2013.67.
Wu et al., Tunable Exciton Funnel Using Moiré Superlattice in Twisted van der Waals Bilayer. Nanoletters. American Chem Soc. 2014;14:5350-7.
Yan et al., Angle-Dependent van Hove singularities and their breakdown in twisted graphene bilayers. Physical Review B. Sep. 2, 2014;90:115402. 16 pages.
Yankowitz et al. Emergence of superlattice Dirac points in graphene on hexagonal boron nitride. Nat Phys. Mar. 25, 2012;8:382-6. DOI: 10.1038/NPHYS2272.
Ye et al. Competition of shape and interaction patchiness for self-assembling nanoplates. Nat Chem. May 12, 2013;5:466-73. DOI: 10.1038/NCHEM.1651.
U.S. Appl. No. 14/818,035, filed Aug. 4, 2015, Li et al.
PCT/US2013/050325, Jan. 13, 2015, International PreliminaryReport on Patentability.
PCT/US2015/043549, Oct. 16, 2015, Invitation to Pay Additional Fees.
PCT/US2015/043549, Jan. 7, 2016, International Search Report and Written Opinion.
PCT/US2013/050325, Feb. 20, 2014, International Search Report and Written Opinion.

* cited by examiner

STRAIN ENGINEERED BANDGAPS

CROSS-REFERENCE TO RELATED APPLICATION

This application claims the benefit under 35 U.S.C. §119 (e) of U.S. provisional application Ser. No. 61/670,752, filed Jul. 12, 2012, the disclosure of which is incorporated by reference in its entirety.

FIELD

Disclosed embodiments are related to strain engineered band gaps.

BACKGROUND

The interaction of light and other electromagnetic radiation with materials is well-studied. One important class of such interactions includes optoelectronic devices, e.g., photovoltaic devices in which exposure of the material to light causes separation of charge in the material, and the flow of electrical current. Typically, in such devices, only a single wavelength (or frequency) of radiation can be utilized by the device to produce current, thus the process is inherently somewhat inefficient. These or similar devices can also be used as radiation emitters, where current is applied, and radiation is emitted from the material, again typically at a single wavelength. Thus, while photovoltaic devices and emitters are known, new devices would advance several fields.

SUMMARY

One aspect of the invention involves optoelectronic devices that can interact with light and facilitate the collection of charge carriers, e.g., electrical current, in a manner that is advantageous in relation to what has been developed previously. Inhomogeneous strain as applied to materials has been discovered, in accordance with many aspects of the invention, to be an important vehicle to obtain good results. In one embodiment of this aspect, an optoelectronic device includes a first optoelectronic material that is inhomogeneously strained as well as a first charge carrier collector and a second charge carrier collector. The first charge carrier collector and the second charge carrier collector are each in electrical communication with the first optoelectronic material and are adapted to collect charge carriers from the first optoelectonic material.

In another aspect of the invention, methods of using optoelectronic devices are provided. In one such embodiment, a method of using an optoelectronic device includes exposing a first inhomogeneously strained optoelectronic material to electromagnetic radiation, absorbing a first portion of the electromagnetic radiation with the first inhomogeneously strained optoelectronic material to generate holes and electrons, and collecting the holes and electrons to produce an electric current.

In another embodiment, a method of using an optoelectronic device includes injecting electrons and holes into an inhomogeneously strained optoelectronic material, and emitting electromagnetic radiation from the inhomogeneously strained optoelectronic material.

In another aspect of the invention, a method of manufacturing an optoelectronic device is provided. In one embodiment of this aspect, the invention includes inhomogeneously straining an optoelectronic material, and placing a first charge carrier collector and a second charge carrier collector in electrical communication with the optoelectronic material, wherein the first charge carrier collector and the second charge carrier collector are adapted to collect charge carriers from the optoelectonic material.

Another aspect of the invention involves using multiple wavelength electromagnetic radiation to separate charge, e.g., create electrical current, in a single material. In one such embodiment, a method includes absorbing in a single optoelectronic material, and converting to electrical current, electromagnetic radiation over an excitation energy range that is between 0.2 electron volts to 1.0 electron volts wide.

The invention realizes advantageous results using materials that are strained both homogenously and/or inhomogenously. For example, another aspect of the invention involves photocatalysis and, in particular, improvements that can be realized by modifying materials to affect photocatalysis. In one embodiment, a method includes photocatalyzing a reaction using a strained optoelectronic material.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures. Additionally, in cases where the present specification and a document incorporated by reference include conflicting and/or inconsistent disclosure, the present specification shall control.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
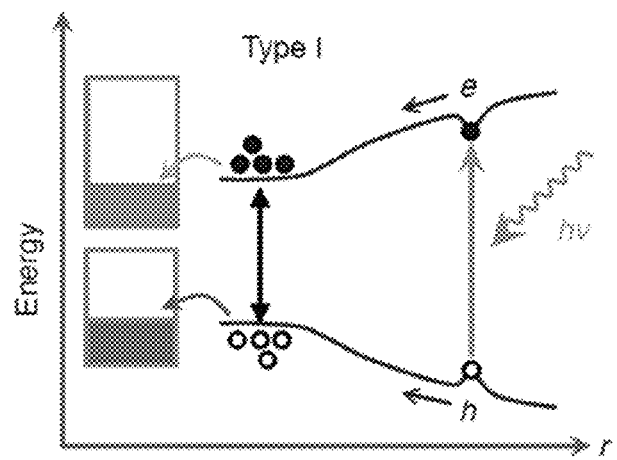
FIG. 1 is a schematic representation of a type I energy funnel.

The inventors have recognized that an optoelectronic material with a spatially varying band gap as well as the ability to continuously control the band gap in optoelectronic materials at low cost is highly desirable for a wide range of energy and sensing applications such as photovoltaics, photocatalysis, photodetection, and light-emitting devices. For example, the efficiency of photovoltaic devices including a single p-n junction is subject to the thermodynamic constraint of the Shockley-Queisser limit since a single junction is only able to absorb a limited portion of the incident solar energy corresponding to the band gap energies absorbed by that junction. Although tandem solar cells consisting of multi-junctions with cascaded band gaps can achieve a higher absorption efficiency, the increased complexity of fabrication as well as the high cost of materials are still major challenges. Therefore, it would be advantageous if the band gap could be fine-tuned within a single semiconducting material to improve the performance and efficiency of the device.

The inventors have recognized that similar to chemical composition, the elastic strain in a material is a continuous variable capable of impacting many physical and chemical properties including the band gap of a material. However, elastic strain engineering is not used in many applications due to the fact that many conventional bulk-scale materials cannot sustain a high enough elastic strain to induce sufficient changes to their physical properties prior to the onset of plastic deformation or fracture. Recently, an emergent class of materials, named "ultrastrength materials", has been found to avoid inelastic relaxation up to a significant fraction of their ideal strength due to materials at different size scales and dimensionalities exhibiting dramatically larger mechanical strength as well as distinct physical and chemical properties. Atomically thin sheets are a notable family of materials that exhibit ultrastrength. For example, theoretically predicted and experimentally measured elastic strain of a graphene monolayer is as high as 25%, while that of bulk graphite rarely survives beyond 0.1% strain. Recently, molybdenum disulphide ($MoS_2$) monolayer was also experimentally exfoliated and characterized with an effective in-plane strain of up to 11% and a direct band gap of 1.9 eV in a strain-free condition. Without wishing to be bound by theory, the inventors have recognized that the high elastic strain limit associated with these ultrastrength materials enables the control of their electronic and optical properties through the use of simple elastic strain engineering that is often infeasible in their three dimensional bulk phases. Thus, elastic strain can conceivably be applied for rapid and reversible tuning of the band gap in a material. While, ultrastrength materials are noted above, it should be understood that the concept of using elastic strain to modify the electronic and optical properties of a material may be used with any appropriate optoelectronic material capable of supporting sufficient elastic strain.

In addition to using the elastic strain to control the band gap, the inventors have recognized that an inhomogeneous elastic strain applied to an optoelectronic material can create spatially varying properties within the material. More specifically, an elastic inhomogeneous strain may be used to create a spatially varying band gap. Without wishing to be bound by theory, a spatially varying band gap may permit the optoelectronic material to absorb a larger portion of the incident light due to the range of band gap energies present in the inhomogeneously strained optoelectronic material as compared to the individual band gaps present in the unstrained material. Since the inhomogeneously strained optoelectronic material absorbs a greater portion of the incident light, junctions incorporating such a material may also exhibit a higher efficiency.

The optoelectronic devices described herein may incorporate an optoelectronic material capable of supporting sufficient elastic strain to affect the band gap of the optoelectronic material. Possible materials include, but are not limited to: GaS; GaSe; GaTe; $MX_2$ type of dichalcogenides where M=Mo, Nb, Ni, Sn, Ti, Ta, Pt, V, W, or Hf and X=S, Se, or Te; $M_2X_3$ type of trichalcogenides where M=As, Bi, or Sb and X=S, Se, or Te; $MPX_3$ where X=S or Se; $MAX_3$ where A=Si or Ge and X=S, Se, or Te; and alloy sheet like $M_xM'_{1-x}S_2$. Several specific materials that have been computationally confirmed to exhibit desirable optoelectronic properties as well as being able to support sufficient elastic strain include molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), chromium disulfide ($CrS_2$), chromium diselenide ($CrSe_2$), chromium ditelluride ($CrTe_2$), gallium arsenide nanosheet, germanium nanosheet, and gallium indium phosphide nanosheet. The optoelectronic material may also include more conventional materials capable of supporting sufficient elastic strain. For example, a crystalline, polycrystalline, and/or amorphous silicon nanosheet can sustain tensile strain of a few percent which is sufficient to induce a smaller though still significant change in the band gap.

In addition to the particular material used, the optoelectronic material may have any appropriate form. The optoelectronic devices described herein may incorporate an optoelectronic material in any form capable of supporting sufficient elastic strain to affect the band gap of the optoelectronic material. In some instances, the optoelectronic material may be a thin sheet. However, bulk materials capable of supporting sufficient elastic strain to alter their band gap structure may also be used. Depending on the particular optoelectronic material, the sheet may be a two dimensional atomically thin sheet such that it includes anywhere from two atomic layers to several atomic layers and may be on the order of 1 nm in thickness. Additionally, in some embodiments, the thin sheet may include a single atomic layer, known as a monolayer, of the optoelectronic material. Without wishing to be bound by theory, the use of atomically thin sheets and monolayers will result in larger elastic strains due to the fewer intrinsic defects present in these two-dimensional materials as compared to bulk materials which can lead to stress concentrations, plastic deformation, and ultimately fracture of the materials. In addition to using single atomically thin sheets and monolayers of the optoelectronic materials noted above, in some embodiments, stacking of multiple layers and/or multiple materials may be used to provide a desired composite optoelectronic material.

As described in more detail in the examples, $MoS_2$ was specifically investigated using both theoretical and computational studies and found to be a viable material out of the many materials listed above for creating a continuously varying band gap profile in an initially homogeneous, atomically thin sheet. An optoelectronic device made of nanoindented $MoS_2$ monolayer was computationally demonstrated to be capable of absorbing a broad range of the solar spectrum from 2.0 eV to 1.1 eV as the biaxial strain increases from 0% to 9%. More importantly, the continuous spatial variation of electron and hole energies together with the large exciton binding energy in the $MoS_2$ monolayer makes it a unique solar energy funnel to convey and concentrate the photoexcited charge carriers along the elastic strain gradient. Consequently, a device engineered to apply a range of strains from 0% up to about 9% may exhibit a range of excitation energies that is about 0.9 eV wide. If larger strains are applied to the $MoS_2$ monolayer, a correspondingly wider range of excitation energies is expected. In addition to the above, the lattice symmetry of $MoS_2$ may be used to provide very unique valley-selective circular dichroism.

For the sake of clarity, the embodiments described below are directed to an optoelectronic device that absorbs incident light energy. However, it should be understood that the currently described optoelectronic devices may also be used as emitters in which case the charge carrier collectors may be termed charge carrier injectors. Examples of possible applications include, but are not limited to, strain engineered solar cells, solar energy funnels, light emitting diodes, optomechanical sensors, and/or photodetectors. If an appropriate resonator is devised for these materials, another possible application is exciton lasing due to the exciton concentrating at the center of the inhomogeneously strained materials followed by radiative recombination which may result in stronger luminescence near the center of the sheet.

Turning now to the figures, the effects of inhomogeneous elastic strain on the band gap of optoelectronic materials as well as several embodiments of optoelectronic devices incorporating these materials are described in more detail.

As noted above, an inhomogeneous strain field can be used to create a device whose electronic structure possesses continuous spatial variation. Without wishing the bound by theory, this may be used to create an energy funnel which in some embodiments may be appropriately tuned to be a solar energy funnel. The concept of creating an energy funnel using electronic band energy and optical band gap engineering has been experimentally demonstrated in several nanostructures with graded gaps such as layer-by-layer assembled CdTe nanocrystals with different sizes and core-shell and corrugated carbon nanotube filaments. Here, however, the energy funnel is provided by engineering continuously varying electronic and optical band energies via inhomogeneous elastic strain engineering using a material with homogeneous chemical composition. The varying profile of the band energy leads to the funneling effect. The present approach is enabled by recent rapid advances in the studies of two-dimensional and atomically thin sheets, such as graphene, hexagonal boron-nitride, and $MoS_2$ monolayer which have been experimentally exfoliated and characterized to confirm that they possess very high elastic strain limits. In addition, $MoS_2$ has some other attractive properties such as high thermal stability and chemical inertness which lend itself to use in a device.

Figure 2:
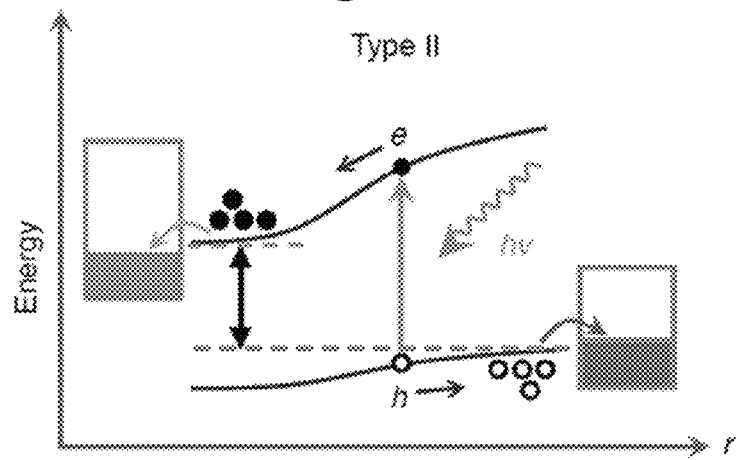
FIG. 2 is a schematic representation of a type II energy funnel.
Figure 3:
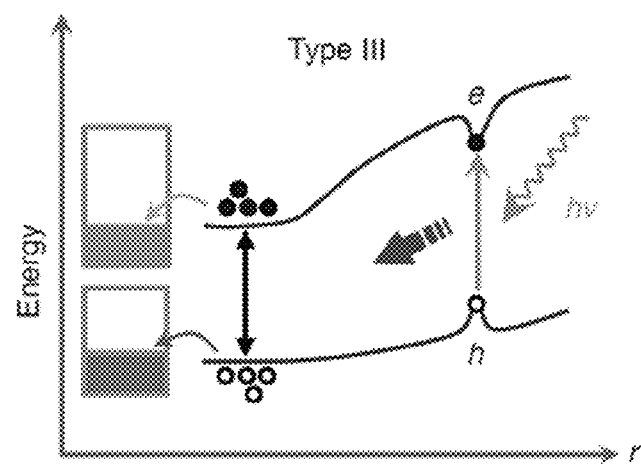
FIG. 3 is a schematic representation of a type III energy funnel.

Based on energy profiles of quasiparticles (i.e., electrons and holes) and photoexcited states (i.e., free electron-hole pairs or strongly bound excitons), three funneling mechanisms are possible in an inhomogeneously strained optoelectronic material, see FIGS. 1-3. The figures illustrate the energy levels of the charge carriers for a material versus the radial position. Increasing radial position corresponds to decreasing strain within the material. The figures also illustrate the migration of electrons e and holes h for different types of funneling mechanisms after incident electromagnetic radiation hv forms an electron hole pair within the inhomogeneously strained optoelectronic material.

In a Type I funnel, the energy level of photoexcited electrons e continuously decreases towards the center while that of holes h increases, see FIG. 1. Consequently, both the electrons e and the holes h migrate towards the region of greater strain at the center of the device. Therefore, the charge carriers are concentrated at the center, as long as the lifetime of the charge carriers is large enough for the charge carriers to migrate to the center prior to the eventual electron-hole recombination. In contrast to a Type I funnel, if both charge carrier energy levels decrease with increasing strain, the direction of charge carrier migration will depend on the strength of the Coulomb interaction between the quasiparticles, i.e. exciton binding energy. With weak exciton binding, electron-hole pairs will be separated by the built-in field, and electrons e and holes h will move in opposite directions resulting in a Type II funnel, see FIG. 2. On the other hand, if the binding energy of an exciton is large enough to hold the electron-hole pair together in spite of the built-in field, the decreasing exciton energy profile will drive the exciton including the electron e and hole h to migrate towards the high strain region at the center of the device, see FIG. 3. A device based on this mechanism is classified as a Type III funnel. In all three funnel types, the varying band gap and carrier energy leads to the desired funneling effect. However, the strength of the exciton binding energy determines whether Type II or III funneling will operate in the device when the quasiparticle energy of both electrons and holes decreases toward the center of the optoelectronic material. A key advantage of such a strain-engineered device is that the performance of these devices can be adjusted to the lighting environment, as the optical band gap is also continuously tunable using the elastic strain present within the material.

Due to the charge carriers moving in the same or opposite directions depending on the type of funneling mechanism present in the optoelectronic material, an optoelectronic device may include charge carrier collectors that are arranged to capture the charge carriers according to their drift motion within the inhomogeneously strained electrode material. For example, in Type I and III funnels, an optoelectronic device may include charge carrier collectors that are aligned with one another and are electrically associated with higher strain regions of the optoelectronic material in order to capture the charge carriers moving towards these higher strain regions. In contrast, in Type II funnels, an optoelectronic device may include a charge carrier collector that selectively collects electrons that are located in a higher strain region of the optoelectronic material and a corresponding charge carrier collector that selectively collects holes that are located in a lower strain region of the optoelectronic material since the charge carriers move in opposite directions. Additionally, in some embodiments, the optoelectronic material may have a size that is greater than the recombination length of the electron hole pair. In such an embodiment, a plurality of charge carrier collectors may be associated with the optoelectronic material such that the distance between the plurality of charge carrier collectors is less than or equal to the recombination length of the electron hole pair. However, embodiments in which the distance between the plurality of charge current collectors is greater than the recombination length of electron hole pairs are also possible.

Figure 4:
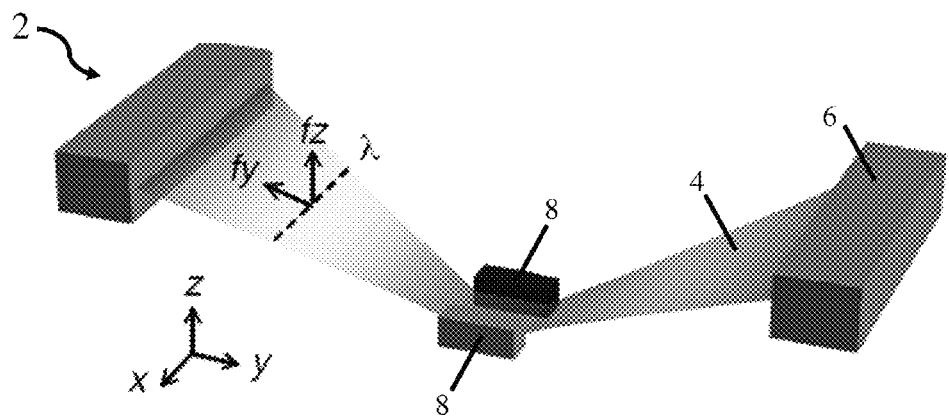
FIG. 4 is a schematic representation of an inhomogeneously strained sheet of optoelectronic material with a narrowing geometry.
Figure 5:
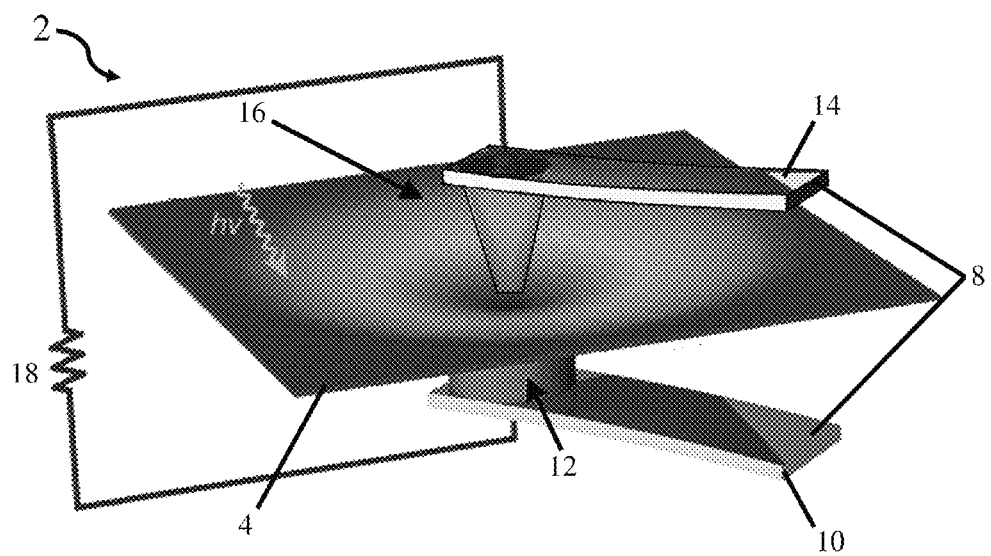
FIG. 5 is a schematic representation of a device for inhomogeneously straining a sheet of optoelectronic material.

Two separate embodiments of possible optoelectronic devices which are capable of inducing an inhomogeneous strain within an optoelectronic material to create a continuously varying band gap profile in an initially homogeneous sheet of optoelectronic material are illustrated in FIGS. 4 and 5. In some embodiments, the sheet of optoelectronic material may be a atomically thin sheet or monolayer of optoelectronic material. In one embodiment, such an optoelectronic device can be used as a photovoltaic device to capture a broad range of solar spectrum and concentrate the charge carriers for collection.

FIG. 4 depicts an optoelectronic device 2 including a sheet 4 made from an optoelectronic material and an associated clamping substrate 6 that holds the sheet 4 in place. The depicted sheet 4 exhibits two separate portions that include narrowing geometries directed towards a central portion of the device. In some embodiments, the narrowing geometries may be continuously narrowing geometries. Further, while a sheet has been depicted including two separate portions, it should be understood that a sheet including a single portion exhibiting a continuously narrowing geometry is possible. The optoelectronic device 2 also includes electrodes 8 associated with the center of the sheet 4. The electrodes 8 may also include appropriate charge carrier collectors, not depicted. As depicted in the figure, the electrodes 8 are aligned with one another corresponding to a Type I or III energy funnel though other arrangements are possible.

In the depicted embodiment, the electrodes 8 are used to create a vertical offset and corresponding strain in the sheet 4. While a vertical offset to create the strain in the sheet 4 has been depicted, it should be understood that other mechanisms could be used to create the strain. For example, the sheet may be arranged in a single plane and a strain might be created in plane using any appropriate mechanism including thermal mismatch of materials during manufacture, microratchets, and Push-to-Pull devices to name a few. Regardless of the manner in which the strain is created, the narrowing geometry of the sheet results in an inhomogeneous strain. More specifically, the region of lower strain will correspond to the wider portion of the sheet and the region of higher strain will correspond to the narrower portion of the sheet. The Föppl-Hencky equation for sheet deformation under a stretching force at the boundaries was used to confirm that the force balance within the sheet and the continuously narrowing sheet geometry efficiently focuses the tensile strain to create an inhomogeneous strain.

Another embodiment of an optoelectronic device 2 is depicted in FIG. 5. The optoelectronic device 2 includes a sheet 4 made from an optoelectronic material as well as a pair of electrodes 8 in electrical communication with the sheet 4. In the depicted embodiment, one of the electrodes 8 is used to deform a central portion of the sheet 4 towards the other corresponding electrode 8 located beneath the sheet 4 to induce an inhomogeneous strain. Without wishing the bound by theory, the stress, and the corresponding strain, will scale inversely with the radial position along the sheet, $\sigma_r \sim 1/r$ for $r<R$ (outer radius). This is due to the effective width of the sheet, which corresponds to length of a circle at a given radius, scales as $r^{-1}$, where $r=(x^2+y^2)^{1/2}$, so the elastic strain and strain-controlled properties (e.g. band gap) would also scale as $r^{-1}$.

In view of the above, the center of the sheet will exhibit the greatest stress and strain and the clamped edges of the sheet will exhibit the lowest stress and strain. The electrode 8 used to deform the suspended sheet may include a charge carrier collector 16 in the form of an indenter. In some embodiments, the indenter is a nanoindenter. The other corresponding electrode 8 may also include another corresponding charge carrier collector 12. These charge carrier collectors may function as carrier-collecting contacts with the sheet 4. The electrodes 8 may include a corresponding anode 10 and a cathode 14 associated with the charge carrier collectors 12 and 16. The anode 10 and the cathode 14 are also in electrical communication with an external load 18 which may be any appropriate load including, for example, a battery, a device, an electrical grid, or any other appropriate application.

As depicted in the figure, the anode 10 and the cathode 14 correspond to cantilever beams. Such an arrangement may be beneficial by limiting the material present between sheet 4 and any incident electromagnetic radiation hv. Further, in some embodiments, the bulk of the electrodes 8 are made of transparent conducting oxide to maximize illumination of the sheet. For example, the anode and/or cathode may be made from a transparent conducting oxide or other appropriate transparent material. Similarly, either one, or both, of the charge carrier collectors 12 and 14 may be made from a transparent material.

In order for the charge carrier collectors 12 and 16 to function properly, it is desirable that they include appropriate buffer layers. In some embodiments, these buffer layers may be semiconducting buffer layers covering the electrodes that are in electrical communication, and in some instances in direct contact, with the sheet 4. The role of these buffer layers is to selectively admit one type of charge carriers (electron or hole) while blocking the other. This helps to suppress direct tunneling of carriers between the anode and cathode and allow for efficient extraction of charge carriers. The desired carrier selectivity is provided by selecting appropriate band alignment which is a standard design principle in photovoltaics. Therefore, the charge carrier collectors 12 and 16 may be made of or coated with an appropriate material exhibiting the desired band edge. Additionally, similar to above, the buffer layers may be made from a transparent material.

The embodiment depicted in FIG. 5 may be used with any appropriate sheet of optoelectronic material including atomically thin or monolayer optoelectronic materials. To avoid changes in the performance of the optoelectronic device during use, it is desirable to reduce or prevent inelastic strain relaxation by dislocation plasticity or fracture. However, while a high-quality atomically thin sheet or monolayer may include minimal lattice defects, the edges may act as preferential sites for stress aided defect nucleation. One way in which to minimize the edge length is to use a sheet with a circular shape. For example, in one embodiment, the sheet 4 may be disposed on and cover a circular hole within a substrate, not depicted, in a manner similar to nanoindentation testing. The edge of the sheet 4 is clamped in place using any appropriate mechanism including, for example, adhesion between the sheet and the substrate surrounding the hole. While the use of a circular hole may be advantageous to minimize the edge length of the sheet, other shapes and arrangements are also possible as the current disclosure is not limited to any particular arrangement.

Figure 6:
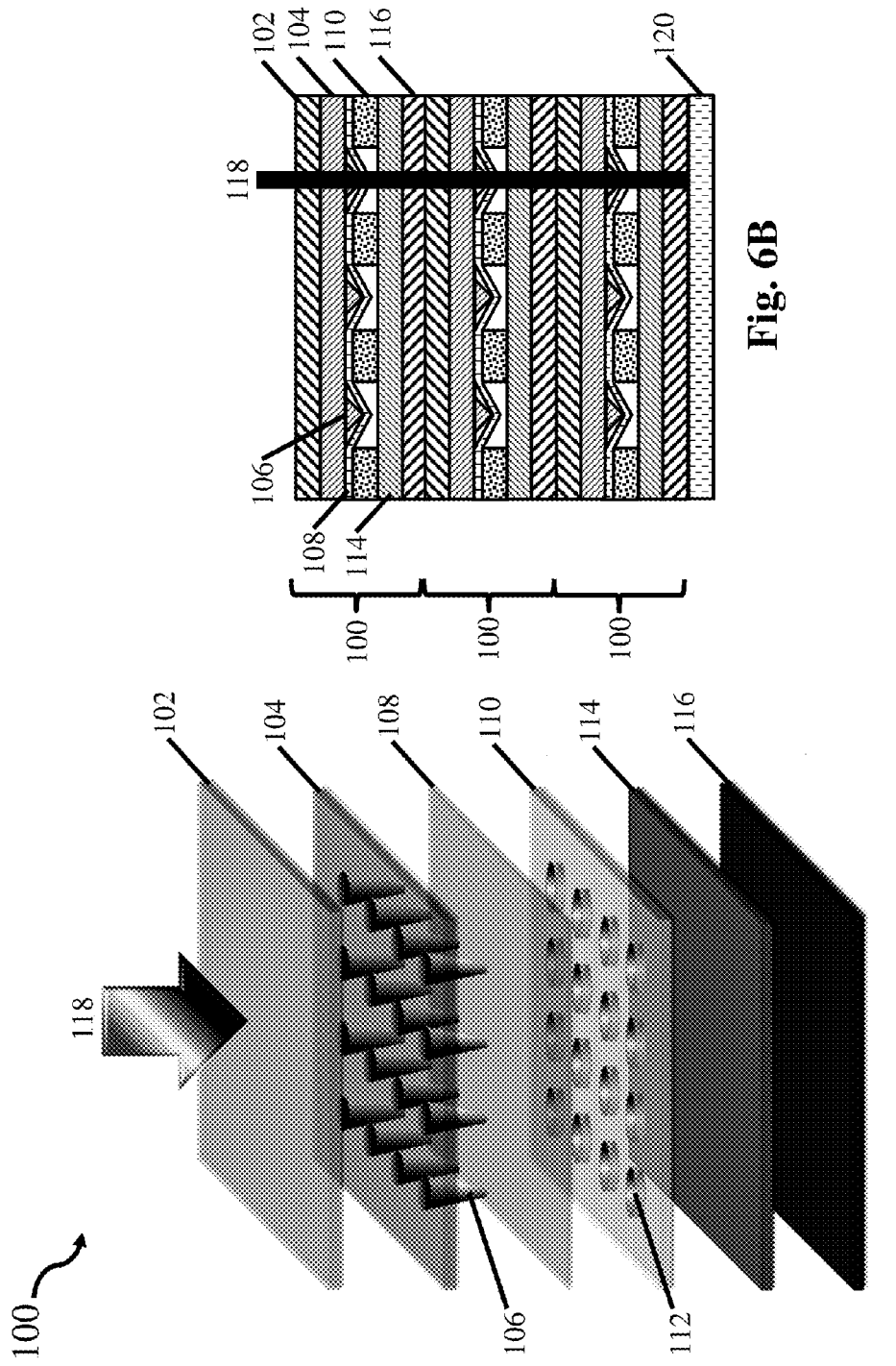
FIG. 6A is a schematic representation of an array of inhomogeneously strained optoelectronic materials.
FIG. 6B is a schematic cross-sectional representation of a plurality of juxtaposed arrays of inhomogeneously strained optoelectronic materials.

In addition to the individual optoelectronic devices described above, superlattice arrays of strain engineered optoelectronic materials may be used to form strain engineered optoelectronic materials over a larger area in order to create functional devices such as solar cells, sensors, and light emitting diode arrays to name a few. One embodiment of an array 100 of strain engineered optoelectronic materials is depicted in FIG. 6A. The depicted array 100 includes an electrode 102. The electrode 102 is in electrical communication with a charge carrier collector 104 which may either be made from, or be coated with, a carrier selective buffer. The charge carrier collector 104 includes a plurality of indenters 106 located on its bottom surface and arranged in a grid pattern. The indenters are made from, or coated with, the same charge selective buffer as the charge carrier collector 104. The indenters may have any appropriate shape and may be formed using any appropriate method. The array 100 also includes a sheet 108 made from an optoelectronic material. In some embodiments, the sheet 108 is an atomically thin material or a monolayer. The sheet 108 is disposed on top of a supporting substrate 110 which includes a plurality of through holes 112 arranged in a grid pattern corresponding to the plurality of indenters. A second charge carrier collector 114 is disposed on a bottom surface of the substrate 110 and is in electrical communication with an electrode 116. The indenters 106 are adapted and arranged to deform the sheet 108 such that it makes contact with the second charge carrier collector 114 through the through holes 112. Similar to the embodiment described above with regards to FIG. 5, the deformation of the sheet 108 results in an inhomogeneous strain within the deformed portions of the sheet. Further, it is this deformation of the sheet 108 by each pair of indenters and through holes that creates the array of strain engineered optoelectronic materials.

After the array 100 is assembled, incoming electromagnetic radiation 118, for example light, passes through the electrode 102, the charge carrier collector 104, and a portion of the incident electromagnetic radiation is absorbed by sheet 108 to form electron hole pairs. Without wishing to be bound by theory, since the sheet 108 includes regions that are inhomogeneously strained, a larger range of band gaps exist in the sheet 108, and a correspondingly larger portion of the electromagnetic radiation is absorbed than is possible using the unstrained optoelectronic material. The electron hole pairs are subsequently selectively collected by the first and second charge carrier collectors 104 and 114 to form a current which is output by the electrodes 102 and 116.

It should be understood, that the array depicted in the figure, and described above, is exemplary. Consequently, other arrangements to form an array of strain engineered optoelectronic materials are possible. For example, the indenters depicted in the figure are nanocones. However any appropriate shape might be used to deform the sheet including, for example, a plurality of nanowires. Additionally, while the current array depicts a plurality of strain engineered optoelectronic materials that are strained to the same amount and thus are tuned to the same characteristic excitation (electronic and electromagnetic), one or more of the strain engineered optoelectronic materials in the array might be tuned to a separate characteristic excitation. This may be accomplished by engineering the strain of the sheet 108 to be different in different portions of the sheet using, for example, different length indenters 106 to deform the sheet 108 to different predetermined strains.

The materials in the arrays and individual devices described above may be manufactured in any appropriate manner including, for example, chemical vapor deposition, physical vapor deposition, hydrothermal synthesis, intercalation-assisted exfoliation, mechanical exfoliation, electrochemical synthesis, and thermolysis of precursors to name a few. Similarly, the holes in the support substrates may be generated in any appropriate fashion including, but not limited to, ion-bombardment, electron beam milling, selective etching, photolithography, and reactive ion etching. The indenters 106 may also be produced by catalytic growth and combination of chemical or physical vapor deposition and chemical etching as well as other appropriate methods.

In order to fix the nanoindented stacked layers, microratchets from microelectromechanical systems can be used to clamp the top surface and the bottom surface together. The microrachets may be electrically isolated from the top surface and bottom surfaces in order to avoid a short circuit of the generated charge carriers. Depending on the size of the device, the microratchets can be periodically placed through the stacked device. Other mechanisms and methods to fix the stacked layers may also be used.

Without wishing to be bound by theory, due to the use of a thin sheet of material, the optoelectronic material does not absorb all of the incident electromagnetic radiation corresponding to the range of band gaps provided in the inhomogeneously strained optoelectronic material. Instead, a portion of the electromagnetic radiation is transmitted through the optoelectronic material. In some embodiments, it is desirable to try and capture the remaining unabsorbed portion of the incident electromagnetic radiation 118. There are several ways in which to try and capture the remaining unabsorbed portion of the incident electromagnetic radiation 118. FIG. 6B illustrates two possible methods for increasing the absorption of the incident electromagnetic radiation 118. The figure depicts a cross-section of multiple arrays 100 that are disposed on top of one another. The arrays 100 are arranged such that the strained portions of the multiple sheets 108 are aligned with one another. By juxtaposing these regions of the sheets 108, the unabsorbed portion of the electromagnetic radiation 118 that is transmitted through a single layer of the sheet 108 may be absorbed by the underlying sheet of electronic material. It should be understood, that any number of juxtaposed arrays may be used. Additionally, in some embodiments, the materials used to form the electrodes and/or the charge carrier collectors are transparent to minimize absorption losses of the incident electromagnetic radiation. In addition to the use of juxtaposed strain engineered optoelectronic materials, a reflective layer 120 may be provided on a bottom surface of the device to reflect the electromagnetic radiation 118. By arranging the reflective layer 120 on the bottom surface of the device, the electromagnetic radiation 118 is reflected back along its original path and passes through the strain engineered optoelectronic materials a second time thus increasing the absorption efficiency of the device.

Figure 7:
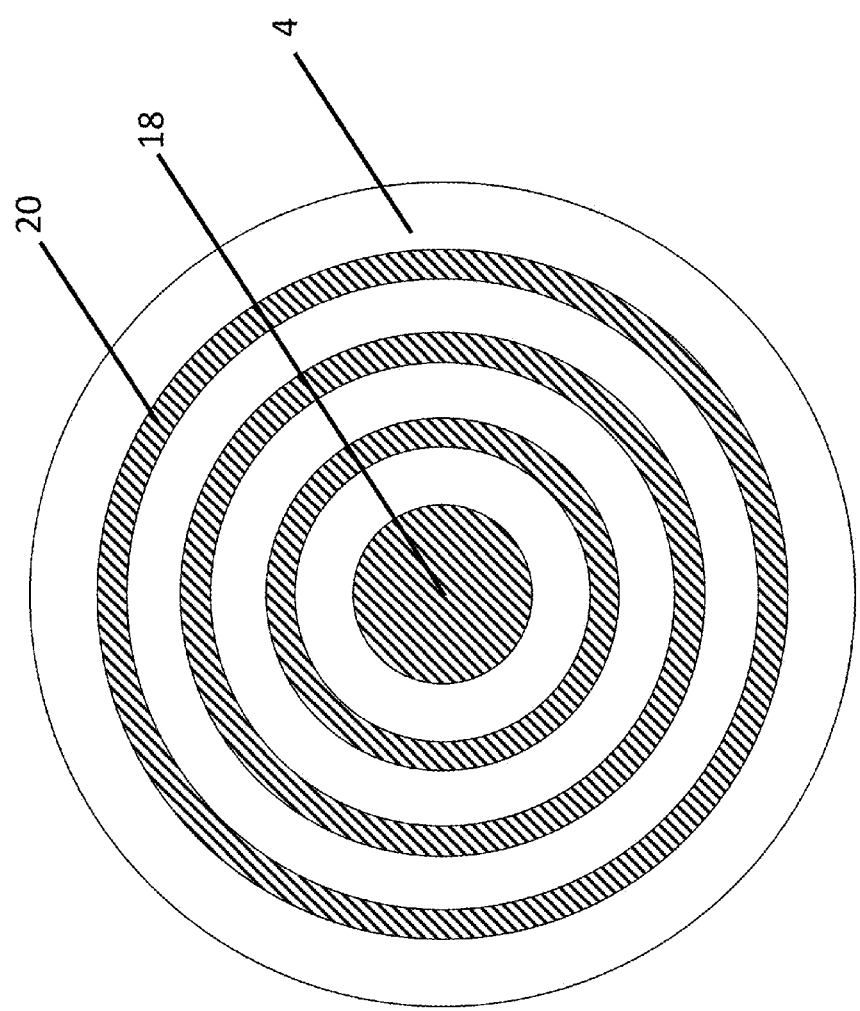
FIG. 7 is a schematic representation of concentrically arranged charge carrier collectors disposed on an inhomogeneously strained sheet of optoelectronic material.

Another way in which to enlarge the area covered by the strain engineered optoelectronic materials is to increase the size of the inhomogeneously strained optoelectronic materials. However, the electron-hole pairs formed in the optoelectronic material recombine after a certain amount of time. Due to the drift of the electron-hole pairs within the optoelectronic material, this corresponds to a recombination length. Further, in order to maximize the device efficiency it is desirable to collect these charge carriers prior to their recombination. Consequently, in embodiments using sheets of inhomogeneously strained optoelectronic materials that are larger than the recombination length of the charge carriers, a plurality of charge carrier collectors may be used. The plurality of charge carrier collectors may be spaced such that the distance between the electrodes is equal to or less than the recombination length of the electron hole pairs within the inhomogeneously strained optoelectronic material. One possible embodiment is depicted in FIG. 7. In the depicted embodiment, a sheet 4 of inhomogeneously strained optoelectronic material is in electrical communication with a central charge carrier collector 18 as well as a plurality of concentrically arranged charge carrier collectors 20. The distance between the central charge carrier collector 18 and the next concentrically arranged charge carrier collector 20 as well as the distance between the concentrically arranged charge carrier collectors is less than or equal to the recombination length of the electron hole pairs within the inhomogeneously strained optoelectronic material. It should be understood, that the depicted charge carrier collectors are associated with selectively collecting a single charge carrier. A corresponding plurality of charge carrier collectors associated with selectively collecting the other charge carrier may be arranged on the opposite side the sheet 4.

While a specific arrangement of charge carrier collectors is depicted, other arrangements are also possible. Additionally, while it may be preferable to have a distance between the charge carrier collectors and electrodes that is less than the recombination length of the electron hole pairs, in some embodiments the distance between the charge carrier collectors may be greater than the recombination length of the electron hole pairs as the current disclosure is not limited in this fashion. Additionally, the plurality of charge carrier collectors may be in electrical communication with a corresponding plurality of electrodes, or they may be in electrical communication with a single electrode.

Depending on the particular optoelectronic material and the applied inhomogeneous strain field, the recombination length may be on the order of about 500 nm to about 5 µm. Consequently, the distance between the plurality of charge carrier collectors may be less than or equal to about 500 nm, 750 nm, 1 µm, 2 µm, 3 µm, 4 µm, 5 µm, or any other appropriate distance.

As noted above, and in the examples, the range of excitation energies for the band gaps associated with strained $MoS_2$ is about 0.9 eV wide for strains ranging from 0% to about 9%. A wider range of excitation energies is also expected for larger ranges of inhomogeneous strain applied to $MoS_2$ and/or other optoelectronic materials. Consequently, in one embodiment the range of excitation energies of an inhomogeneously strained optoelectronic material may be greater than or equal to about 0.2 eV, 0.3 eV, 0.4 eV, 0.5 eV, or any other appropriate energy. Correspondingly, the range of excitation energies of an inhomogeneously strained optoelectronic material may be less than or equal to about 1.0 eV, 0.9 eV, 0.8 eV or any other appropriate energy. For example, the excitation energies associated with a strained optoelectronic material may be between, and inclusive of, 0.2 eV and 1.0 eV or 0.3 eV and 0.9 eV.

As noted above, elastic strains as high as 25% have been observed in several ultrastrength materials, whereas the corresponding bulk materials may only exhibit 0.5% strain prior to fracture. Consequently, in some embodiments, an optoelectronic material may have a strain greater than or equal to about 1%, 2%, 3%, 4%, 5%, 10%, 15%, or any other appropriate amount of strain. Correspondingly, the optoelectronic material may have a strain less than or equal to about 25%, 20%, 15%, 10%, or any other appropriate note of strain. For example, in one embodiment the optoelectronic material may have a strain that is between, and inclusive of, 1% and 10% or 1% and 25%. The above noted strains may either be homogeneous strains or inhomogeneous strains.

The above embodiments have been directed to optoelectronic devices that create static inhomogeneous strains within a material. Consequently, these optoelectronic devices will exhibit a static range of bandgap energies. However, depending on the application, it may be desirable to provide a dynamic range of bandgap energies. For example, it may be desirable to tune the absorption characteristics for a sensor, or the spectrum of light emitted from a light emitting diode. Since the range of bandgap energies can be altered by changing the amount of inhomogeneous strain present within the optoelectronic material, in some embodiments, it is desirable to dynamically vary the inhomogeneous strain within the optoelectronic material during use. An optoelectronic device may alter the inhomogeneous strain within the optoelectronic material using any appropriate method including, for example, MEMS thermal expansion, push-to-pull devices, and biasing of piezoelectric materials.

Figure 8:
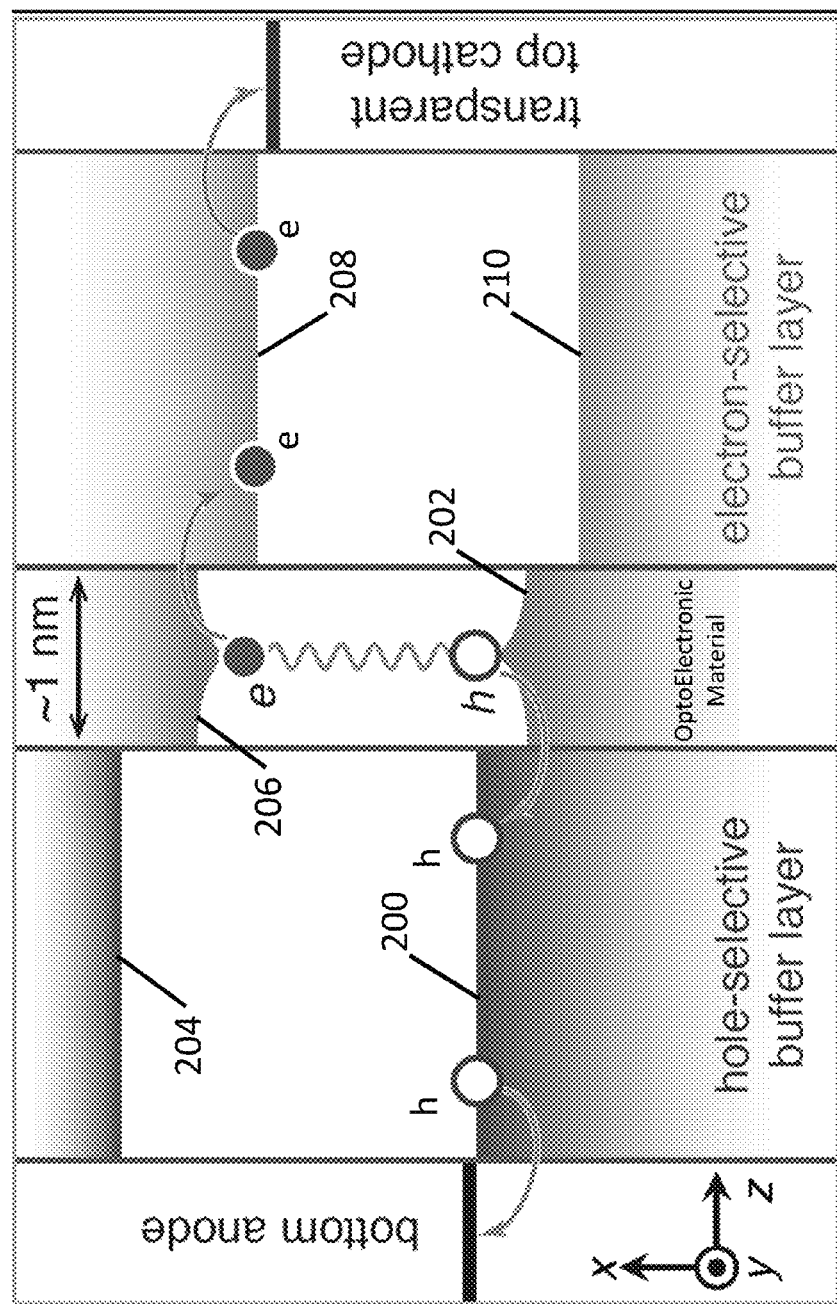
FIG. 8 is a schematic representation of charge extraction from a sheet of optoelectronic material.

Regardless of whether or not the band gap energy of an optoelectronic material is static or dynamic, the buffer layers present within an optoelectronic device may be selected to control the charge extraction from the optoelectronic material. A schematic representation of charge extraction near the center of an atomically thin sheet of optoelectronic material is depicted in FIG. 8. As depicted in the figure, the sheet of optoelectronic material is oriented parallel to the xy plane. If an optoelectronic device such as that depicted in FIG. 5 were used to strain the sheet of optoelectronic material, the indentation would be directed along the z direction. When an electron hole pair is formed in the sheet of optoelectronic material, the electrons e are transferred to the electron selective buffer layer and subsequently to the cathode. Similarly, the holes h are transferred to the hole selective buffer layer and subsequently to the anode. Without wishing to be bound by theory, the selective transfer of holes and electrons is dictated by the relative levels of the conduction band edges and valence band edges of the various materials. More specifically, in the depicted embodiment, the hole selective buffer layer material, has a valence band edge 200 that matches with or is a little bit higher than the optoelectronic material's valence band edge 202, and its conduction band edge 204 is higher than the optoelectronic material's conduction band edge 206. Similarly, the electron selective buffer layer material has a conduction band edge 208 that matches with or is a little bit lower than the optoelectronic material's conduction band edge 206, and its valence band edge 210 is lower than the optoelectronic material's valence band edge 202. In this setup, holes can only upflow (move in the direction of increasing band energy) to the anode through the hole selective buffer layer, while electrons can only downflow (move in the direction of decreasing band energy) to the cathode through the electron selective buffer layer. Thus, direct tunneling of electrons and holes from the optoelectronic material to the anode and cathode respectively is blocked.

In one particular embodiment, the optoelectronic material is a $MoS_2$ monolayer, the hole selective buffer layer is GaP, and the electron selective buffer layer is $SnO_2$. The $MoS_2$ monolayer has a conduction band edge energy of −4.5 eV, a valence bandage energy of −6.0 eV, and an exciton energy level of 1.1 eV. The hole selective buffer layer of GaP has a conduction band edge energy of −3.5 eV and a valence band edge energy of −5.8 eV. The electron selective buffer layer of $SnO_2$ has a conduction band edge energy of −5.0 eV and a valence band edge energy of −8.5 eV. The above band edge energies are relative to the vacuum level. While specific buffer layers for use with a $MoS_2$ monolayer are described above, other optoelectronic materials and buffer layer materials are possible.

Simple screening tests may be used to determine if a material is appropriate for use as a strain engineered optoelectronic material. For example, nanoindentation and microindentation testing may be used to evaluate whether or not a material is capable of supporting large elastic strains. Additionally, the computational methods described below as well as several simple experimental methods may be used to evaluate the band gap energies of a material as well as their potential for being modified using elastic strain. First-principles computational methods that may be used include, but are not limited to, density-functional theory (DFT), time-dependent density functional theory (TDDFT), many-body Green's function method within quasiparticle approximation, and Bethe-Salpeter equation (BSE) can be applied to determine the strain-dependent quasiparticle (i.e., electron and hole) energy levels and optical excitation energies as well as optical absorption materials. Possible experimental methods to evaluate the electron and hole energy levels and optical absorption spectra of the material with and without strain include, but not limited to, electrical transport measurement, angle-resolved photoemission spectroscopy, and photoluminescence spectroscopy.

The above embodiments have been directed to the concept of a tunable optoelectronic device that either absorbs electromagnetic radiation to create a current or accepts a current to generate electromagnetic radiation. However, strain engineered optoelectronic materials may also be used for photocatalysis including, for example, splitting water using photocatalysis. Therefore, unlike tuning a band gap using compositional changes as is typically done, a strain engineered optoelectronic material offers the ability to easily tune the band gap energy for a particular reaction without the need to undergo lengthy composition development and testing. Additionally, since the optoelectronic material is not being used to create a current or emit light, there is no need to include buffer layers or electrodes as described above which simplifies the manufacturing and use of the system. However, it should be understood that many of the properties and device arrangements described above are also applicable to optoelectronic materials used in photocatalysis.

In one embodiment, a photocatalytic reaction uses a sheet of optoelectronic material. Depending on the embodiment, the sheet of optoelectronic material may be an atomically thin sheet or a monolayer of the optoelectronic material. A predetermined amount of strain is applied to the sheet of optoelectronic material to tune the band gap energy to a desired energy corresponding to the desired reaction energy. While an inhomogeneous strain may be used to provide a range of band gap energies, in one embodiment, the strain applied to the optoelectronic material is a homogeneous strain. Without wishing to be bound by theory, a homogeneous strain will result in a constant band gap energy across the sheet. Since the reaction energy does not correspond to a range of energies, a homogeneous strain providing a constant band gap energy should provide a more efficient photocatalyst. In one embodiment, a setup similar to that depicted in FIG. 3, but using a constant width ribbon of optoelectronic material, is used to provide a homogeneous strain. However, it should be understood that any appropriate method of providing a homogeneous strain in an optoelectronic material may be used.

Without wishing to be bound by theory, a photocatalytic reaction rate increases with increasing surface area of the photocatalyst. Consequently, it may be desirable to increase a surface area of the optoelectronic material. In one embodiment, a surface area of the optoelectronic material may be increased by creating pores in the sheet of optoelectronic material. The pores may be created using any appropriate method including, but not limited to, electron beam milling, selective etching, photolithography, reactive ion etching, and ion-bombardment, and combinations of the above. Without wishing to be bound by theory, it should be noted, that the introduction of pores, as well as other possible defects, into the sheet of optoelectronic material may limit the elastic strain that may be applied prior to the onset of plastic deformation and fracture. Consequently, the size and density of the pores may be limited to provide a desired elastic strain limit for a material and a desired band gap energy. Appropriate combinations of pore size and density may be easily evaluated using nanoindentation and/or microindentation testing methods.

Similar to the optoelectronic devices described above, the optoelectronic materials used as a photocatalyst may either be manufactured to exhibit a static band gap, or the optoelectronic materials may be engineered to exhibit a dynamic band gap that may be adjusted to a desired energy by adjusting the strain applied to the optoelectronic material. Again the strain applied to the optoelectronic material may be adjusted using any appropriate method including, but not limited to, MEMS thermal expansion, push-to-pull devices, and biasing of piezoelectric materials. The ability to adjust the band gap may permit the optoelectronic material to be used as a photocatalyst for multiple reactions by simply adjusting the applied strain to match the band gap energy to the desired reaction energy.

Materials for use as a photocatalyst may be easily screened using a variety of methods. In one embodiment, the energy of a particular reaction may be determined and materials exhibiting somewhat similar band gaps as well as large elastic limits may be identified. The band gap of the identified materials may then be evaluated versus the applied elastic strain. Those materials that exhibit a range of possible band gap energies between zero strain and the elastic limit of the material that include the desired reaction energy may be used as photocatalyst for the reaction. For example, water has a photocatalytic splitting energy of approximately 1.23 eV at 0 pH and monolayer $MoS_2$ as described herein has a range of band gap energies between about 1.1 eV to about 2.0 eV over a range of strains between zero strain and 9% strain. Thus, strain engineered $MoS_2$ could be used as a photocatalyst for water splitting. Other atomically thin semiconducting materials such as $MoSe_2$, $MoTe_2$, $WSe_2$, to name a few, have smaller band gaps than $MoS_2$, and may be even better candidates for splitting water as they may require less strain to reach the optimal band gap (usually 0.2-0.3 eV above the thermodynamic bound of 1.23 eV at 0 pH) for photocatalytic water splitting.

Example 1

Strain-Dependent Electronic and Optical Properties of $MoS_2$ Monolayer

The effect of biaxial strain up to 9% strain on a $MoS_2$ monolayer was evaluated using first-principles density-functional theory (DFT) calculations. The calculations indicate that both direct and indirect DFT band gaps decrease with increasing biaxial strain. Further, a transition from direct band gap to indirect band gap occurs once the biaxial strain is applied.

Figure 9:
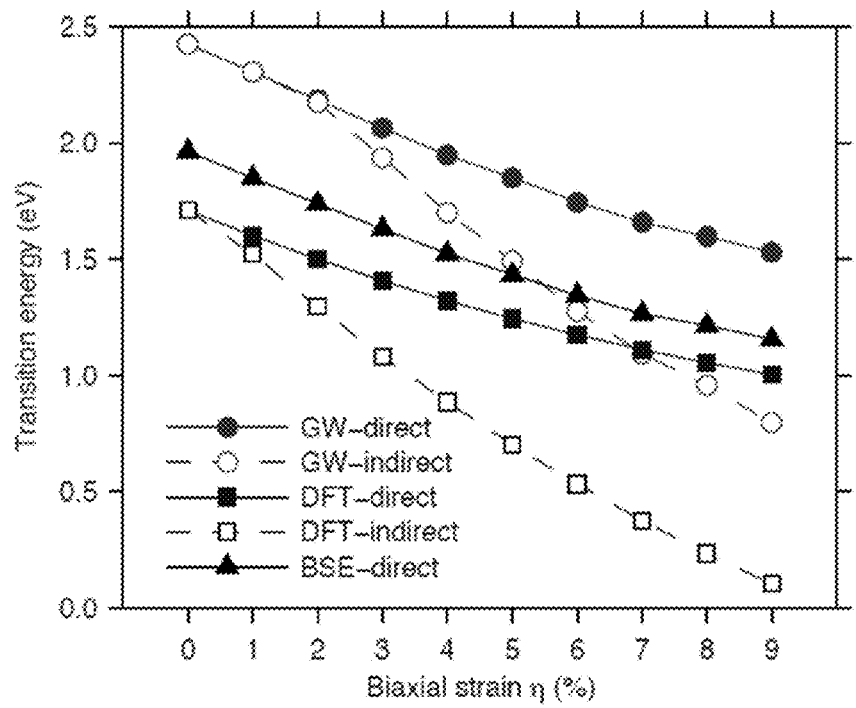
FIG. 9 is a graph of the calculated direct and indirect band gaps under different biaxial strains.
Figure 10:
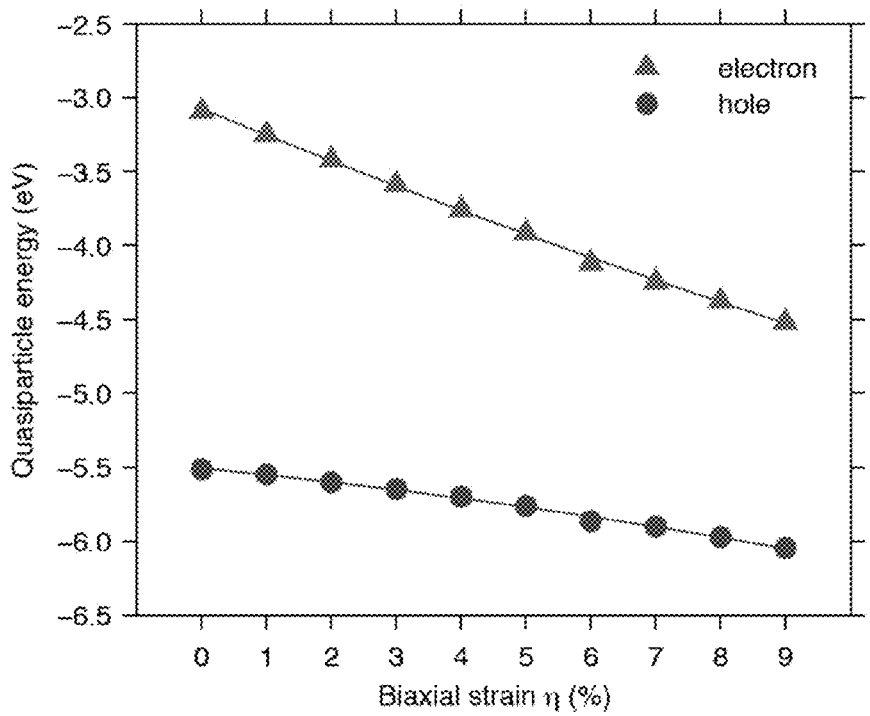
FIG. 10 is a graph of calculated biaxial strain dependent electron and hole quasiparticle energy levels with respect to vacuum.

In order to acquire accurate electronic band energy profiles for the device design, many-body GW calculations (G: Green's function, W: screened Coulomb interaction) were also performed to determine the strain-dependent electronic band gaps and the strain-dependent energy levels for electrons and holes at the K point, see FIGS. 9 and 10. The direct and indirect band gaps calculated from DFT and GW were similar except a constant shift of 0.7 eV was observed. Additionally, dielectric functions and electron energy loss spectrum of a $MoS_2$ monolayer were also predicted to undergo substantial changes under biaxial tensile strain.

Figure 11:
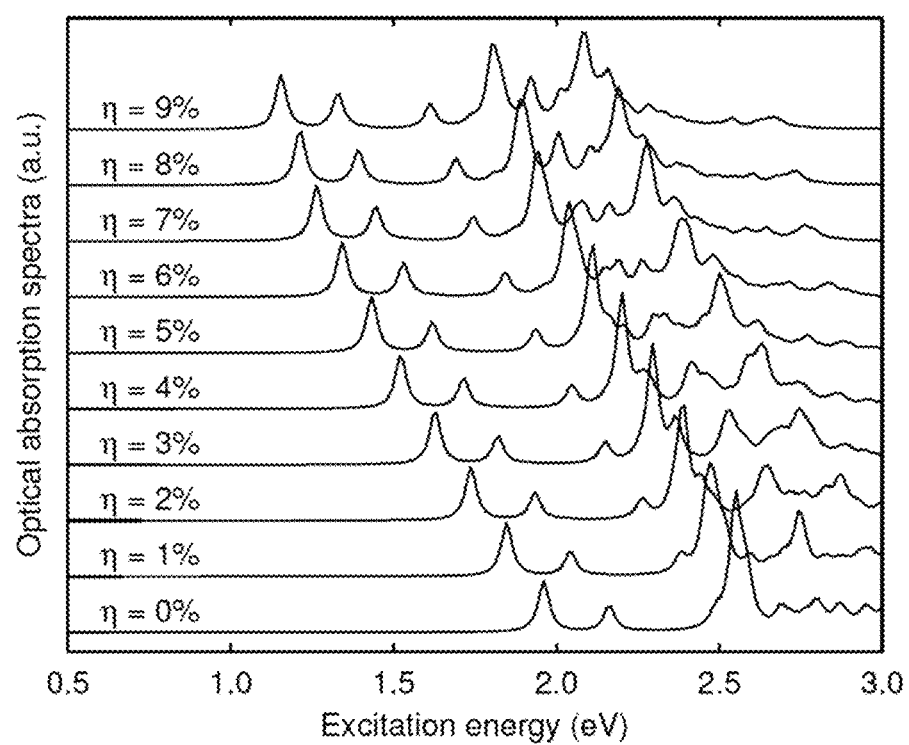
FIG. 11 is a graph of calculated biaxial strain dependent optical absorption spectra.

The biaxial strain not only affects the above electronic band gaps, but also modifies its absorption spectra and optical gap—another physical quantity applicable to the device operation. As screening is generally reduced in a two-dimensional material, photoexcited quasiparticles in monolayer $MoS_2$ are expected to experience stronger Coulomb attractions. Therefore, going beyond the Random Phase Approximation the Bethe-Salpeter equation (BSE) was used on top of GW quasiparticle energies. The calculated strain-dependent optical absorption spectra clearly indicated that the direct-to-indirect transition of band gap upon biaxial strain does not affect the strength of optical absorption, see FIG. 11. Instead, it only shifts the whole spectrum towards the low energy regime. The calculated exciton energy of 2.0 eV at zero strain is in excellent agreement with the A peak at 1.9 eV measured using photoluminescence (PL) spectroscopy (The fine structure due to spin-orbit coupling is ignored here). However, the excitation energy experiences substantial reduction when the strain is imposed, and decreases to 1.1 eV at 9% biaxial strain. A roughly constant exciton binding energy of 0.5 eV from 0% to 9% biaxial strain was also calculated. Such large constant exciton binding energy together with the calculated reduced quasiparticle energies makes the strain-engineered $MoS_2$ monolayer a Type-III solar energy funnel.

Example 2

$MoS_2$ Monolayer Under Nano-Indentation

Figure 12:
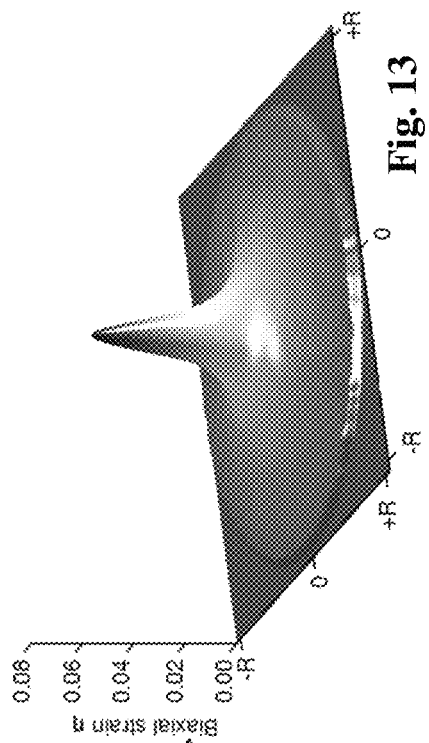
FIG. 12 is a schematic representation of the deformation calculated for an indented molybdenum disulfide monolayer.

To compute the morphology of $MoS_2$ monolayer in the proposed device, a bicontinuum finite-element simulation was used with a force field parameterized in the Tersoff potential form. This coarse-grained force field method yielded essentially the same sheet morphology as the analytical solution to the Föppl-Hencky equations. The computed morphology of the deformed sheet showed characteristic scale invariance; that is, w/R as a function of r/R was nearly independent of R for R>100 Å, where w is vertical displacement at radius r. In practice, a force probe with a rounded tip can be used to avoid a stress singularity near the center. A relaxed atomic structure of nanoindented $MoS_2$ sheet is shown in FIG. 12 with a maximum vertical displacement of Z=R/5. The displacement increases gradually toward the center of the sheet. This is expected as the boundary conditions (edge clamping and central indenting) possess cylindrical symmetry, and the hexagonal lattice of the $MoS_2$ monolayer implies the same symmetry in the Young's modulus and Poisson ratio. The computed biaxial strain field is visualized in FIG. 13. Right at the clamped rim of the suspended sheet, the biaxial strain has a small abrupt increase due to the boundary used in the simulation. As one moves inward, the strain quickly increases, corresponding to the increase in the radial stress. Due to the rounded tip of force probe, the elastic strain does not diverge near the center of the sheet.

Figure 13:
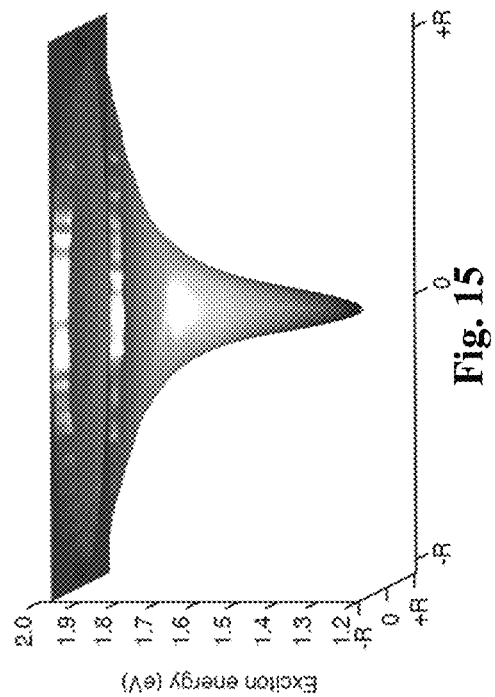
FIG. 13 is a schematic representation of the calculated biaxial strain in the indented molybdenum disulfide sheet of FIG. 12.
Figure 14:
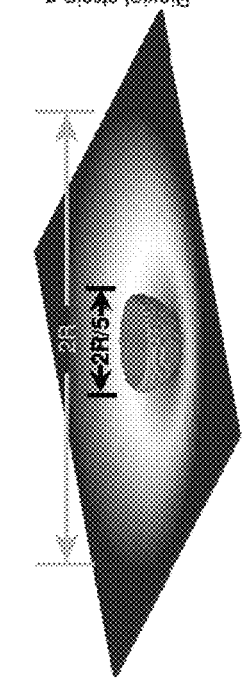
FIG. 14 is a schematic representation of the quasiparticle energies in the indented molybdenum disulfide sheet of FIG. 12.
Figure 15:
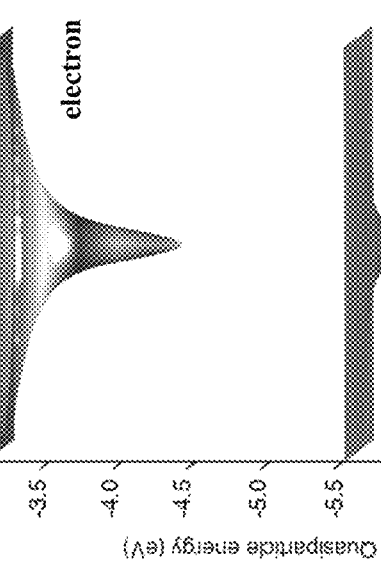
FIG. 15 is a schematic representation of the optical exciton energy profiles in the indented molybdenum disulfide sheet of FIG. 12.

With the computed strain pattern shown in FIG. 13, it is possible to map out the energy profiles of electronic and optical excitations on the sheet in a semiclassical sense, using the properties calculated for $MoS_2$ monolayer under different homogeneous biaxial strain presented above. The mapped band edges of electrons and holes and the energy profile of excitons for the representative sheet are shown in FIGS. 14 and 15 respectively. Both valence and conduction band edges corresponding to the electron and hole energies respectively are shifted downward from the rim to the center. At the region with slowly varying strain, there is a large plateau where the positions of the band edges are almost constant, whose area is almost ⅔ of the circular region. The spatial variation of exciton energy in the sheet, except for the sign difference, is very similar to the strain profile as the total exciton energy changes almost linearly with respect to the applied biaxial strain as noted above in Example 1.

Example 3

Exciton Drift Length

The size of Type III solar energy funnel device is essentially constrained by exciton drift length, beyond which radiative recombination will dominate before it reaches the electrodes at the center. Exciton drift length can be estimated as $$l_{drift} = (v)_{drift}\tau_{1/2} = \frac{\nabla E_{exc}}{m_{exc}}\tau_{dephase}\tau_{1/2}$$

where $\tau_{1/2}$ is the exciton lifetime, and $(v)_{drift}$ is the average drift velocity. The latter is then estimated by the acceleration of exciton due to exciton energy gradient $\nabla E_{exc}$ within phase relaxation time $(v)_{drift}$. The exciton mass is denoted $m_{exc}$. In the case of a single pair of charge carrier collectors, it is desirable to have most excitons collected at the center of the sheet. Therefore, the radius of the sheet may be set to the drift length, i.e., $R=l_{drift}$. Hence, the spatial gradient of exciton energy $\nabla E_{exc}$ can be approximated by $\Delta E_{exc}/R$. Therefore, the effective sheet radius is, $R=\sqrt{m_{exc}^{-1}\Delta E_{exc}\tau_{dephase}\tau_{1/2}}$. In the plateau region, the energy variation $\Delta E_{exc}$ is about 0.1 eV. Since the exciton mass $m_{exc}$ and phase relaxation time $\tau_{dephase}$ are unknown, they can be approximated by the electron rest mass $m_e$ and ~5 ps in GaAs, respectively. Fortunately, exciton lifetime $\tau_{1/2}$ of $MoS_2$ monolayer has been recently measured, with a fast PL decay component of 5 ps at temperature of 4.5~150 K and a slow decay component of 100 ps at 270 K. Then, the estimated radius of atomic sheet is about 660 nm and 3 μm for the fast and slow decay component, respectively.

Compared to the above characteristic size of the sheet, the exciton radius of 2 nm is indeed much smaller, meaning that the strain profile continuously and smoothly varies over the length scale compared to the exciton size in the region of interest. Therefore, the continuum strain mapping procedure is justified. Now it is entirely plausible that upon excitation from the ground state, the excitons will be swept by the strain-induced potential gradient and funneled toward the center. As both hole and electron carriers are bound in the same direction, it is expected that the sheet will stay essentially charge neutral during the device operation. This is advantageous, as otherwise charging may significantly reduce the efficiency of carrier funneling. The final charge separation and harvest of solar energy can be achieved by contacting an electron-collecting transparent semiconductor on top and a hole-collecting semiconductor at bottom, similar to the device depicted in FIG. 5. The semiconductors may have appropriate band edge alignments to ensure one-way flow of electrons and holes as in standard photovoltaic technology. As the electron-hole pairs represent energetic excited states, the sheet device works like a battery with an electropotential $\Delta V_{ext} < \Delta V_{int}$.

Example 4

Inhomogeneous Elastic Strain in Atomically Thin Sheet

When subjecting an atomically thin sheet to a simple external load as shown in FIG. 4 of the paper, an inhomogeneous strain field is created. The equilibrium geometry at the thin sheet limit is given by the Föppl-Hencky equation for a sheet deformation under stretching force only at the boundaries, $$\sigma_{\alpha\beta} \frac{\partial^2 w}{\partial \alpha \partial \beta} = 0, \frac{\partial \sigma_{\alpha\beta}}{\partial \beta} = 0$$

where $\alpha, \beta = x, y$, $w$ is the displacement along z-direction, $\sigma_{\alpha\beta}$ the stress tensor, and the pressure differential across the sheet is taken to be zero. The first and second equations express the force balances along the z-direction and x-y plane, respectively. For the geometry depicted in FIG. 4, for any line $\lambda(y)$ there is, $h\int_\lambda dx \sigma_\alpha = f_\alpha$ where $f_\alpha$ is the stretching force on the boundary and h is nominal sheet thickness. Apparently, the average tensile stress in the y-direction along line $\lambda(y)$ is $$\bar{\sigma}_\alpha = \frac{|f_\alpha|}{h\lambda(y)}$$

Thus, a continuously narrowing sheet geometry can efficiently focus the stress and the tensile strain. For a simple concentric geometry, for example a circular geometry, the width w scales as $r^{-1}$, where $r=(x^2+y^2)^{1/2}$, so the elastic strain and strain-controlled properties (e.g. band gap) would also scale as $r^{-1}$.

Example 5

Ground-State Atomic and Electronic Structure of Monolayer MoS$_2$

MoS$_2$ belongs to a family of two-dimensional semiconductors, the transition metal dichalcogenides MX$_2$ (X=S, Se). The structure of MoS$_2$ monolayer includes a Mo atom which sits in a cage formed by six sulfur atoms, forming a remarkable trigonal prismatic geometry. Crystal field splitting in such geometry determines its electronic structure, resulting in the states near the band gap largely residing on Mo atoms. This is clearly seen from electronic density of states (DOS) obtained using first-principles density-functional theory (DFT) calculations. Owing to its hexagonal space group (P6̄m2) symmetry, MoS$_2$ monolayer has isotropic in-plane elasticity, so the band gap depends only on the hydrostatic strain invariant in 2D (i.e., biaxial strain), $\eta_{hydro}=(\eta_{xx}+\eta_{yy})/2$, in the linear order. Therefore the discussion above has focused on the effect of biaxial strain on the electronic and optical properties of MoS$_2$ monolayer.

However, it is known that DFT using local density approximation or generalized gradient approximation of exchange-correlation functional usually underestimates by 30%-50% the true quasiparticle band gap. Therefore the calculated DFT band structure and DOS only provide qualitative information of electronic structure of monolayer MoS$_2$ which is why the quasiparticle GW calculations for electron and hole energy levels and the Bethe-Salpeter equation (BSE) for optical excitation energy and absorption spectrum were used above. These two quantities together with the nonlinear strain map were used in developing the proposed device design.

Example 6

Strain-Dependent Dielectric Functions and Electron Energy Loss Spectrum of Monolayer MoS$_2$ The strain-dependent real $\in_1$ and imaginary $\in_2$ part of the dielectric functions and electron energy loss spectrum (EELS) of monolayer MoS$_2$ was calculated for light polarized parallel to the monolayer surface. They were computed using density-functional perturbation theory within the random-phase approximation. Using the calculations, all three optical properties were found to be altered significantly under biaxial strain, which could be important for designing two-dimensional photonic crystal using arrays of strain-engineered atomic sheets.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. An optoelectronic device comprising:
a first optoelectronic material that is inhomogeneously strained over at least one portion of the first optoelectronic material, wherein the inhomogeneous strain continuously and smoothly varies over the at least one portion of the first optoelectronic material; and a first charge carrier collector and a second charge carrier collector each in electrical communication with the first optoelectronic material, wherein the first charge carrier collector and the second charge carrier collector collect charge carriers from the first optoelectonic material.

2. The optoelectronic device of claim 1, wherein the first optoelectronic material is a sheet.

3. The optoelectronic device of claim 2, wherein the sheet is a monolayer.

4. The optoelectronic device of claim 1, wherein the first charge carrier collector includes an electron selective buffer layer and the second charge carrier collector includes a hole selective buffer layer.

5. The optoelectronic device of claim 4, further comprising an anode associated with the hole selective buffer layer and a cathode associated with the electron selective buffer layer.

6. The optoelectronic device of claim 1, wherein the first charge carrier collector and the second charge carrier collector are aligned.

7. The optoelectronic device of claim 1, further comprising a third charge carrier collector and a fourth charge carrier collector each in electrical communication with the first optoelectronic material and adapted to collect charge carriers from the first optoelectonic material.

8. The optoelectronic device of claim 7, wherein the third charge carrier collector is located concentrically around the first charge carrier collector, and wherein the fourth charge carrier collector is located concentrically around the second charge carrier collector.

9. The optoelectronic device of claim 7, wherein a distance between the first and second charge carrier collectors and a distance between the third and fourth charge carrier collectors is less than or equal to a relaxation distance of an electron hole pair within the inhomogeneously strained sheet.

10. The optoelectronic device of claim 7, wherein the third charge carrier collector and the fourth charge carrier collector are aligned.

11. The optoelectronic device of claim 1, further comprising a substrate including a hole, wherein the first optoelectronic material is disposed on the substrate and above the hole, and wherein either the first charge carrier collector or the second charge carrier collector comprises an indenter adapted and arranged to inhomogeneously strain the first optoelectronic material.

12. The optoelectronic device of claim 1, wherein the first optoelectronic material comprises a shape with a narrowing width, and wherein the shape is deformed to inhomogeneously strain the first optoelectronic material.

13. The optoelectronic device of claim 1, wherein the first optoelectronic material comprises at least one of molybdenum disulfide, molybdenum diselenide, molybdenum ditelluride, tungsten disulfide, tungsten diselenide, tungsten ditelluride, chromium disulfide, chromium diselenide, chromium ditelluride, silicon, and gallium arsenide.

14. The optoelectronic device of claim 1, wherein the optoelectronic device is a light emitting diode, a solar cell, a photodetector, or an exciton laser.

15. The optoelectronic device of claim 1, further comprising a second optoelectronic material that is inhomogeneously strained.

16. The optoelectronic device of claim 15, wherein the second optoelectronic material is positioned below and aligned with the first optoelectronic material.

17. The optoelectronic device of claim 1, wherein the first optoelectronic material absorbs electromagnetic radiation over a continuous range of wavelengths that is greater than a range of wavelengths over which electromagnetic radiation is absorbed by the optoelectronic material without strain.

18. The optoelectronic device of claim 1, wherein the inhomogeneous strain of the first optoelectronic material is dynamically variable.

19. The optoelectronic device of claim 1, wherein the first and second charge carrier collectors are charge carrier injectors and the first optoelectronic material emits electromagnetic radiation.

20. The optoelectronic device of claim 19, wherein the first optoelectronic material emits electromagnetic radiation over a continuous range of wavelengths greater than a range of wavelengths over which electromagnetic radiation is emitted by the first optoelectronic material without strain.

21. The optoelectronic device of claim 1, wherein the first optoelectronic material absorbs electromagnetic radiation over an excitation energy range that is between or equal to 0.2 electron volts and 1.0 electron volts wide.

22. The optoelectronic device of claim 21, wherein the excitation energy range is greater than 0.5 electron volts wide.

23. The optoelectronic device of claim 21, wherein the excitation energy range is less than 0.9 electron volts wide.

24. The optoelectronic device of claim 2, wherein the first optoelectronic material is an atomically thin sheet.

25. The optoelectronic device of claim 1, wherein the first optoelectronic material is an ultrastrength material.

26. The optoelectronic device of claim 1, wherein the first optoelectronic material is a planar optoelectronic material and the inhomogenous strain is an in-plane inhomeneous strain that continuously and smoothly varies over the at least one portion of the planar optoelectronic material.

27. The optoelectronic device of claim 1, wherein the inhomogeneous strain is greater than or equal to 5% and less than or equal to 25%.

28. An optoelectronic device comprising:
a first optoelectronic material that is strained, wherein the strain of the first optoelectronic material is dynamically variable; and
a first charge carrier collector and a second charge carrier collector each in electrical communication with the first optoelectronic material, wherein the first charge carrier collector and the second charge carrier collector collect charge carriers from the first optoelectonic material.

29. The optoelectronic device of claim 28, where the first optoelectronic material is inhomogeneously strained.

30. The optoelectronic device of claim 28, wherein the first optoelectronic material is a sheet.

31. The optoelectronic device of claim 30, wherein the sheet is a monolayer.

32. The optoelectronic device of claim 28, wherein the first optoelectronic material is atomically thin.

33. The optoelectronic device of claim 28, wherein the first optoelectronic material is an ultrastrength material.

34. The optoelectronic device of claim 28, where the first optoelectronic material is homogeneously strained.

35. The optoelectronic device of claim 28, wherein the first optoelectronic material is a planar optoelectronic material and the strain is an in-plane inhomeneous strain that continuously and smoothly varies over at least one portion of the planar optoelectronic material.

36. The optoelectronic device of claim 28, wherein the strain is greater than or equal to 5% and less than or equal to 25%.

* * * * *